(12) United States Patent
Hung

(10) Patent No.: US 11,397,454 B2
(45) Date of Patent: Jul. 26, 2022

(54) NOTEBOOK COMPUTER AND HEAT DISSIPATION STRUCTURE

(71) Applicant: PEGATRON CORPORATION, Taipei (TW)

(72) Inventor: Tsung-Hsien Hung, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 2 days.

(21) Appl. No.: 17/215,371

(22) Filed: Mar. 29, 2021

(65) Prior Publication Data

US 2021/0357010 A1 Nov. 18, 2021

(30) Foreign Application Priority Data

May 18, 2020 (TW) ................................. 109206098

(51) Int. Cl.
*G06F 1/20* (2006.01)
*H05K 7/20* (2006.01)
*G06F 1/16* (2006.01)

(52) U.S. Cl.
CPC ............ *G06F 1/203* (2013.01); *G06F 1/1681* (2013.01); *H05K 7/2039* (2013.01)

(58) Field of Classification Search
CPC ...... G06F 1/1616; G06F 1/1681; G06F 1/203; G06F 1/1632; G06F 1/166; G06F 1/20; G06F 1/1637; G06F 1/1618; G06F 1/1675; G06F 1/1667; G06F 1/1654; E05D 15/42; F16M 13/005; H05K 7/20145; H05K 7/2039; H01R 13/447; H01R 13/453; H01R 13/5213; H01R 13/6395; H01R 2201/06; H04M 1/0216; Y10T 16/5448; Y10T 403/32327

See application file for complete search history.

(56) References Cited

U.S. PATENT DOCUMENTS 5,196,993 A * 3/1993 Herron .................. F16M 11/10
361/679.55
5,313,362 A * 5/1994 Hatada .................... G06F 1/203
361/736

(Continued)

FOREIGN PATENT DOCUMENTS

TW 201032700 A1 9/2010
TW 201925954 A 7/2019

*Primary Examiner* — Michael A Matey
(74) *Attorney, Agent, or Firm* — Muncy, Geissler, Olds & Lowe, P.C.

(57) ABSTRACT

The laptop includes a host, a screen and a heat dissipation structure. The screen is pivotally connected to the host and includes a clamp member. The heat dissipation structure is connected to the host adjacent to where the screen is pivotally connected and covers a back of the host. The heat dissipation structure includes a back case body and a hatch cover. The back case body defines a heat dissipation opening. One side of the hatch cover is pivotally connected to the back case body. The hatch cover is set to match the heat dissipation opening. When the screen is closed with respect to the host, the clamp member urges the hatch cover to close the heat dissipation opening; when the screen is open with respect to the host, the clamp member is released from the hatch cover, and the hatch cover rotates to expose the heat dissipation opening.

14 Claims, 7 Drawing Sheets

(56) References Cited

U.S. PATENT DOCUMENTS

| | | | |
|---|---|---|---|
| 5,534,891 A * | 7/1996 | Takano | G06F 1/1666 345/169 |
| 5,708,562 A * | 1/1998 | Agata | G05G 9/047 345/169 |
| 5,738,537 A * | 4/1998 | Setoguchi | G06F 1/1632 439/928.1 |
| 5,959,836 A * | 9/1999 | Bhatia | G06F 1/203 361/679.48 |
| 6,094,347 A * | 7/2000 | Bhatia | G06F 1/203 361/679.55 |
| 6,118,654 A * | 9/2000 | Bhatia | G06F 1/1632 361/679.55 |
| 6,239,970 B1 * | 5/2001 | Nakai | G06F 1/166 174/15.1 |
| 6,453,378 B1 * | 9/2002 | Olson | G06F 1/203 361/679.55 |
| 6,501,646 B2 * | 12/2002 | Suzuki | G06F 1/1632 361/679.41 |
| 7,355,843 B2 * | 4/2008 | Riddiford | G06F 1/1624 345/905 |
| 7,733,644 B2 * | 6/2010 | Wilson | G06F 1/1616 361/695 |
| 8,665,589 B2 * | 3/2014 | Lin | G06F 3/0202 361/679.41 |
| 10,973,144 B2 * | 4/2021 | Lee | G06F 3/0221 |
| 2005/0047070 A1 * | 3/2005 | Wang | G06F 1/1681 361/679.27 |
| 2005/0094361 A1 * | 5/2005 | Lee | G06F 1/182 312/223.3 |
| 2008/0297995 A1 * | 12/2008 | Lai | G06F 1/1616 361/679.09 |
| 2009/0016020 A1 * | 1/2009 | Wang | G06F 1/203 361/695 |
| 2011/0075340 A1 * | 3/2011 | Qin | G06F 1/1683 361/679.09 |
| 2012/0090343 A1 * | 4/2012 | Couto | G06F 1/1632 165/59 |
| 2012/0170190 A1 * | 7/2012 | Chen | G06F 1/1681 361/679.01 |
| 2015/0185783 A1 * | 7/2015 | Hui | G06F 1/1624 361/679.29 |
| 2019/0317561 A1 * | 10/2019 | Cheng | G06F 1/1686 |

\* cited by examiner

NOTEBOOK COMPUTER AND HEAT DISSIPATION STRUCTURE

CROSS REFERENCE TO RELATED APPLICATIONS

This Non-provisional application claims priority under 35 U.S.C. § 119(a) on Patent Application No(s). 109206098 filed in Republic of China on May 18, 2020, the entire contents of which are hereby incorporated by reference.

BACKGROUND

Technical Field

The present disclosure relates to a laptop and a heat dissipation structure, and in particular, to a heat dissipation structure of a laptop that can be moved with a screen pivotably hinged to a host.

Related Art

As functions of laptops become more powerful and thinner, the demand for heat dissipation efficiency becomes increasingly important. In particular, industrial laptops or gaming laptops require powerful computing efficiency. When a laptop is operating at a high speed, a large amount of heat energy is generated and needs to be dissipated. Otherwise, if an electronic component such as a processing chip that generates heat in the laptop cannot effectively dissipate heat, usage efficiency is consequently reduced, which even causing damage to the electronic component.

Although there are known heat dissipation mechanisms for active cooling such as fans, water cooling, and a design of heat dissipation fins combined with heat pipes, an additional heat dissipation mechanism can be added to dissipate heat, making it more beneficial to the heat dissipation of a laptop.

SUMMARY

In view of the foregoing subject, the objective of the present disclosure is to provide a heat dissipation structure that can add an additional heat dissipation mechanism to dissipate heat energy when a laptop is operating, which is beneficial to the heat dissipation of the laptop.

Moreover, as a screen of the laptop is open/closed with respect to a host, the heat dissipation mechanism can automatically open/close. A heat dissipation structure provided in the present disclosure opens when the screen of the laptop is open, so that the host forms an outward heat dissipation channel to assist heat dissipation. The heat dissipation structure closes when the screen of the laptop is closed, thereby maintaining a flat appearance and preventing foreign objects from intruding. Relatively good heat dissipation efficiency is achieved in accordance with usage of the laptop.

To achieve the foregoing objective, the present disclosure provides a laptop, including a host, a screen, and a heat dissipation structure. The screen is pivotally connected to the host and includes a clamp member. The heat dissipation structure is connected to the host adjacent to where the screen is pivotally connected and covers a back of the host. The heat dissipation structure includes a back case body and a hatch cover. The back case body defines a heat dissipation opening. The clamp member rotates with opening and closing of the screen to the host inside the back case body. The heat dissipation opening communicates with the back case body and an inside of the host. One side of the hatch cover is pivotally connected to the back case body. The hatch cover is set to match the heat dissipation opening. When the screen is closed with respect to the host, the clamp member urges the hatch cover to close the heat dissipation opening; and when the screen is open with respect to the host, the clamp member is released from the hatch cover, and the hatch cover rotates to expose the heat dissipation opening.

In addition, a heat dissipation structure according to the present disclosure is applied to a laptop. The laptop includes a host and a screen. The screen is pivotally connected to the host and includes a clamp member. The heat dissipation structure is connected to the host adjacent to where the screen is pivotally connected and covers a back of the host. The heat dissipation structure includes a back case body and a hatch cover. The back case body defines a heat dissipation opening. The clamp member rotates with opening and closing of the screen to the host inside the back case body. The heat dissipation opening communicates with the back case body and an inside of the host. One side of the hatch cover is pivotally connected to the back case body. The hatch cover is set to match the heat dissipation opening. When the screen is closed with respect to the host, the clamp member urges the hatch cover to close the heat dissipation opening; and when the screen is open with respect to the host, the clamp member is released from the hatch cover, and the hatch cover rotates to expose the heat dissipation opening.

In an embodiment, the heat dissipation structure further includes an elastic member, disposed at where the hatch cover is pivotally connected. Two ends of the elastic member abut against the hatch cover and the back case body respectively. The elastic member is configured to provide, when subject to a force, a force for the hatch cover to rotate.

In an embodiment, the elastic member is a torsion spring.

In an embodiment, the elastic member is mounted at two ends of a long side of the hatch cover.

In an embodiment, when the screen is closed with respect to the host, the hatch cover is substantially horizontal.

The back case body is provided with a plurality of protruding blocks close to where the hatch cover is pivotally connected.

In an embodiment, the protruding blocks are each provided with a bevel.

In an embodiment, the heat dissipation structure further includes an assembly member for assembling the hatch cover on the back case body.

In an embodiment, the back case body is provided with a guide member for guiding the assembly member during mounting.

Based on the above, the heat dissipation structure of the laptop according to the present disclosure can add an additional heat dissipation mechanism to dissipate heat energy when the laptop is operating, which is beneficial to the heat dissipation of the laptop. In addition, there is no need for a user to manually switch on/off the heat dissipation structure according to the present disclosure. The heat dissipation structure automatically opens as the screen is open with respect to the host, and assists in dissipating heat energy outward. The heat dissipation structure also closes as the screen is closed with respect to the host, thereby maintaining a flat appearance and preventing foreign objects from entering the laptop. Relatively good heat dissipation efficiency is achieved in accordance with usage of the laptop.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

A heat dissipation structure of a laptop according to exemplary embodiments of the present disclosure are described below with reference to related drawings, and same elements are described by using same reference signs.

It should be noted that all directional indications (for example, up, down, left, right, front, back) in the embodiments of the present disclosure are only used for explaining relative position relationships, movement situations or the like between the various components in a specific posture (as shown in the accompanying drawings). If the specific posture changes, the directional indications change accordingly.

In this embodiment, the heat dissipation structure is, for example, but not limited to be applied to a laptop, an industrial laptop, a gaming laptop, or another portable electronic device, provided that a cover of the electronic device needs to be closed and opened. The heat dissipation structure provided in the present disclosure can be combined and applied to the electronic device, to provide an additional heat dissipation mechanism.

Figure 1:
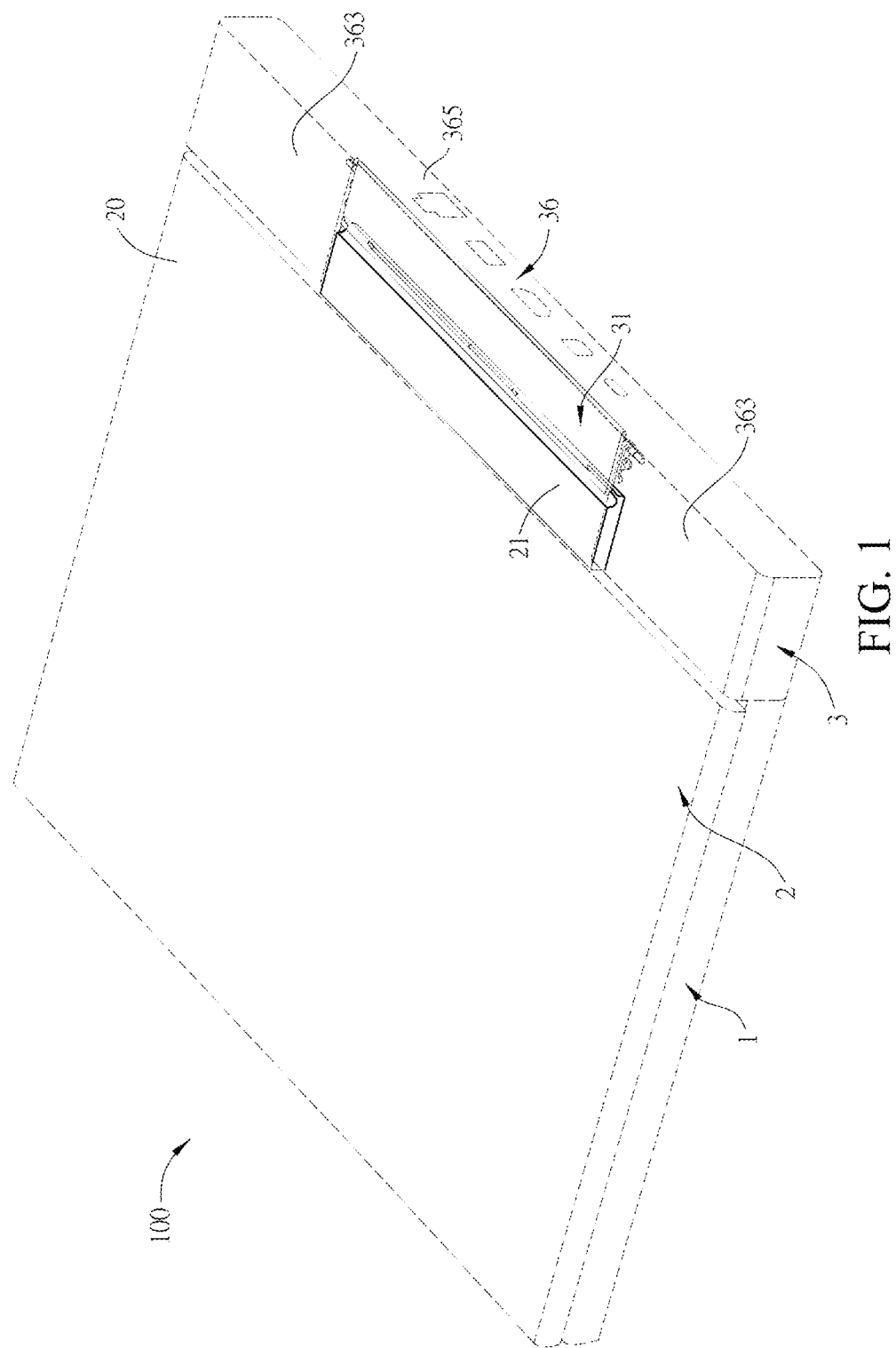
FIG. 1 is a schematic diagram of application of a heat dissipation structure according to an embodiment of the present disclosure.

FIG. 1 is a schematic diagram of application of a heat dissipation structure according to an embodiment of the present disclosure. The laptop 100 includes a host 1, a screen 2, and a heat dissipation structure 3. The screen 2 is pivotally connected to the host 1 (the pivotal part is not shown in the figure), and may rotate with respect to the host 1 to open or close. The screen 2 shown in the figure is closed on the host 1, that is, in a closed position with respect to the host 1. The screen 2 includes a screen body 20 and a clamp member 21, and may rotate with respect to the host 1 to open. The heat dissipation structure 3 is linked to the host 1 and is located at a position adjacent to where the screen 2 is pivotally connected. As shown in FIG. 1, the heat dissipation structure 3 is located behind the screen 2 and the host 1, and covers the back of the host. A height of the heat dissipation structure is equal to a sum of heights of the screen 2 and the host 1 when the screen 2 is closed, that is, substantially equal to a height of the laptop 100. The heat dissipation structure 3 includes a hatch cover 31 and a back case body 36. The back case body 36 includes an upper plate 363 and a lower plate 364 (referring to FIG. 2B) arranged in parallel, and a rear plate 365 perpendicular to the upper plate 363 and the lower plate 364. The upper plate 363 corresponds to the lower plate 364 in a substantially parallel manner. However, a space is defined in a horizontal plane of the upper plate 363, and a heat dissipation opening 3631 is provided. One side of the hatch cover 31 is rotatably pivotally connected to the back case body 36 and disposed in the heat dissipation opening 3631. A plurality of openings 3651 may be provided on the rear plate 365 of the back case body 36 for setting various connection ports.

Figure 2A:
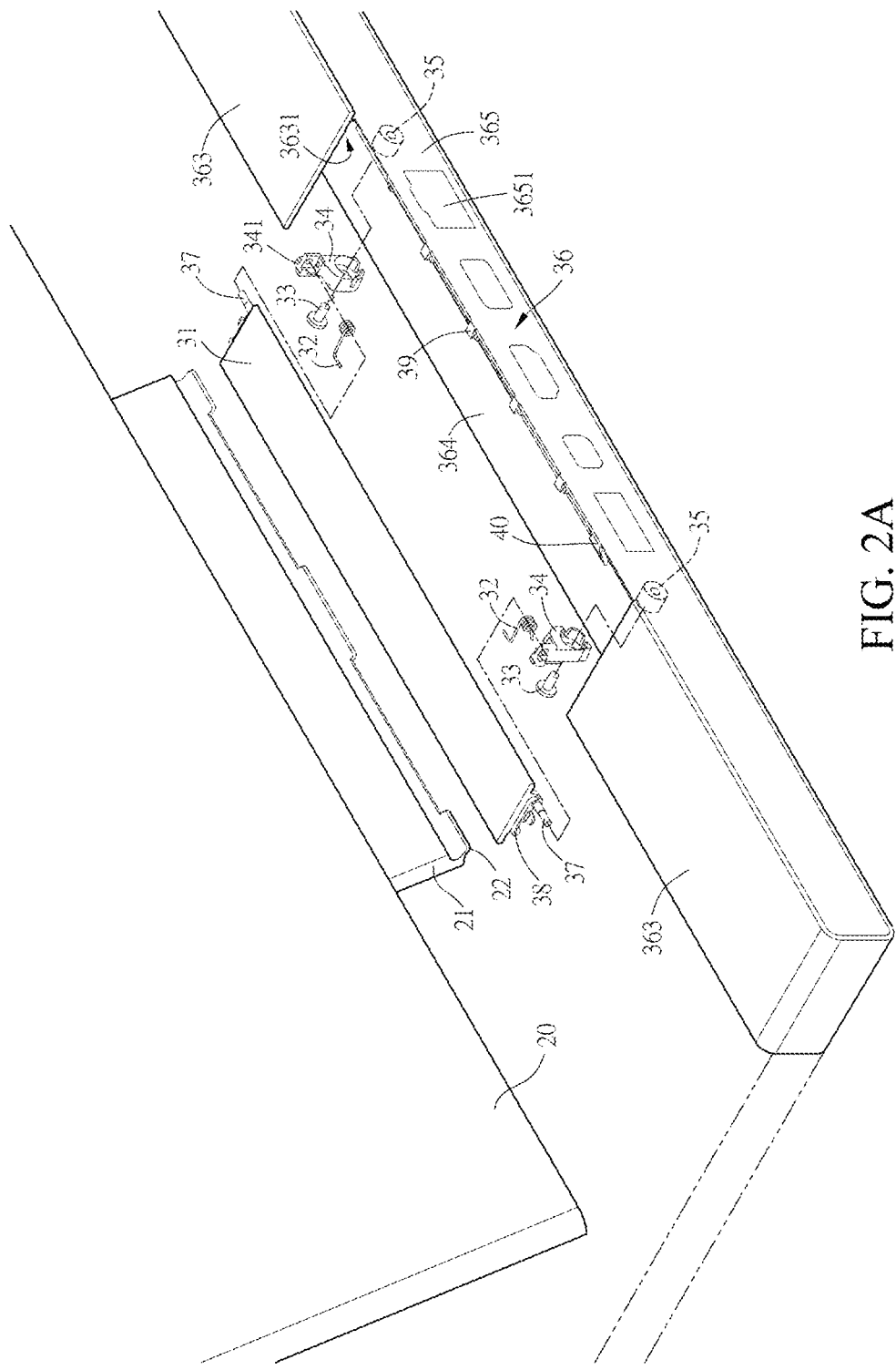
FIG. 2A is a rear-view exploded diagram of a heat dissipation structure according to an embodiment of the present disclosure.
Figure 2B:
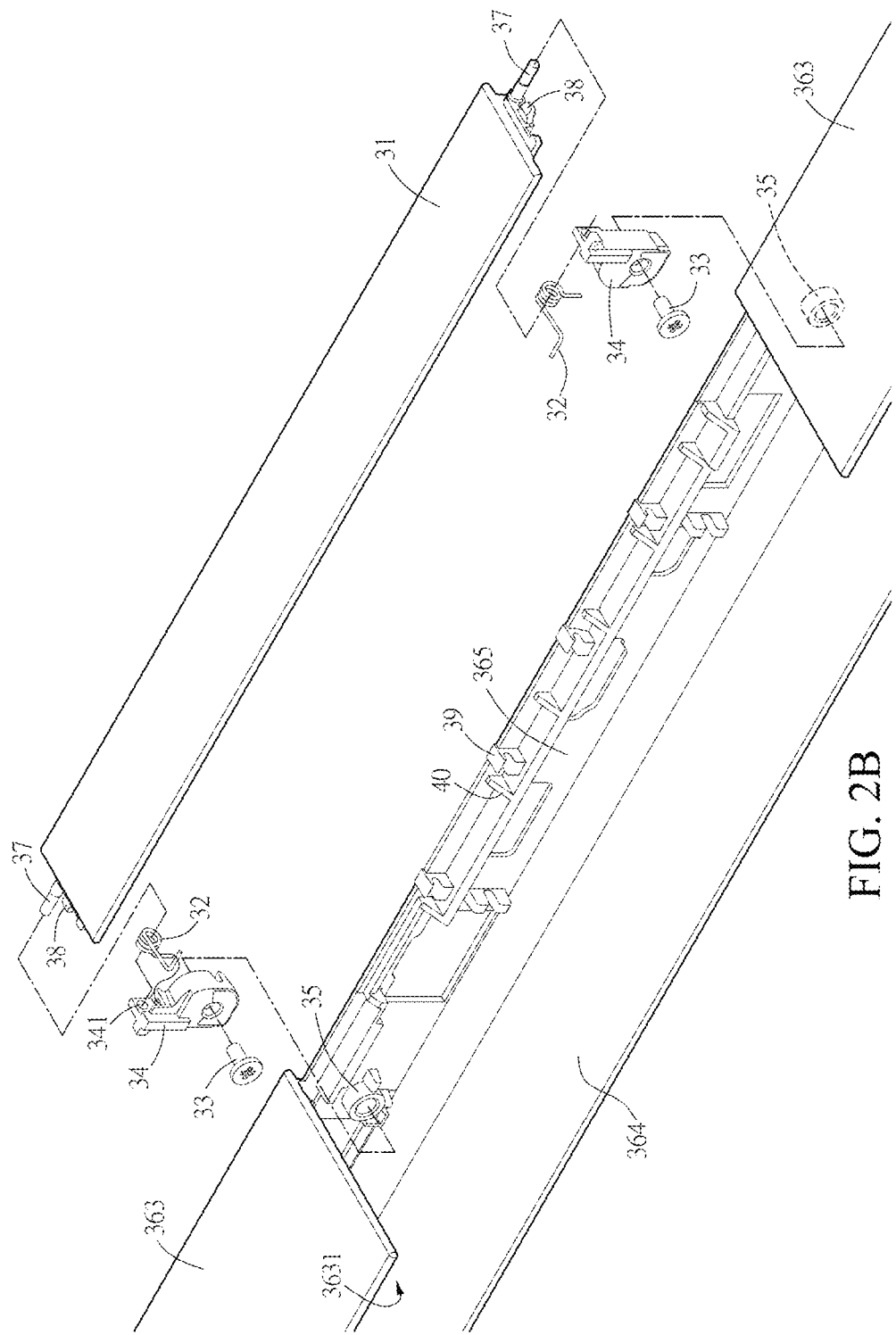
FIG. 2B is a front-view exploded diagram of a heat dissipation structure according to an embodiment of the present disclosure.

FIG. 2A is a rear-view exploded diagram of a heat dissipation structure according to an embodiment of the present disclosure. FIG. 2B is a front-view exploded diagram of a heat dissipation structure according to an embodiment of the present disclosure. As shown in FIG. 2A, a clamp member 21 extends downward from the screen 2. The clamp member 21 then extends to form a clamp portion 22. In this embodiment, the hatch cover 31 is, for example, slightly rectangular, and may alternatively be formed in other shapes, and is not limited thereto. Protruding blocks 38 are respectively provided on two short sides of the hatch cover 31 to abut against the upper plate 363, to limit an upward rotation range of the hatch cover 31 and ensure that the hatch cover 31 and the upper plate 363 are substantially flush and maintain a flat appearance. The heat dissipation structure 3 may further include an elastic member 32 disposed at a position where the hatch cover 31 is pivotally connected to the back case body 36. Two ends of the elastic member 32 abut against the hatch cover 31 and the back case body 36 respectively. The protruding blocks 38 are provided with grooves for accommodating one end of the elastic member 32. The other end of the elastic member 32 is mounted on an assembly member 34 of the heat dissipation structure 3. The hatch cover 31 is provided with a shaft 37 passing through holes 341 on the elastic member 32 and the assembly member 34. The hatch cover 31 is pivotally connected to the back case body 36 through the shaft 37, to be rotatable with respect to the back case body 36. The back case body 36 is provided with a plurality of clamp blocks 39 and oblique stop blocks 40 at a joint with a long side of the hatch cover 31, to limit a downward rotation range of the hatch cover 31 and ensure that the hatch cover 31 stays at an oblique position of a fixed angle. The fixed angle is, for example, but not limited to, between 15 degrees and 35 degrees. The size of the fixed angle is substantially the same as an angle of a bevel on the oblique stop block 40.

Still referring to FIG. 2B, a guide member 35 is further disposed at the back case body 36 at a position corresponding to the assembly member 34, to guide the assembly member 34 to be fixed when the assembly member 34 is fixed to the back case body 36 by using a locking member 33.

In this embodiment, the elastic member 32 is a torsion spring, and the locking member 33 is a screw. However, the elastic member may be, for example, but not limited to, a spring, a compression spring, a tension spring, a torsion spring, a linear spring, a leaf spring, an elastic piece, or the like. In addition to being fixed by using the locking member, the assembly member 34 may be disposed on the back case body 36 alternatively in a manner of adhesion, soldering, welding, or the like, or may be rotatably fixed by using a rotating buckle, but is not limited thereto. In addition, cross-sectional shapes and distribution manners of the clamp blocks 39 and the oblique stop blocks 40 may be, for example, but not limited to, bevel, plane, triangle, square, strip, pentagon, hexagon, or another polygon, or another irregular shape. A friction pad (not shown in the figure) is further provided at a joint of the back case body 36 and the hatch cover 31, so that the back case body 36 and the hatch cover 31 are more closely connected.

Figure 3:
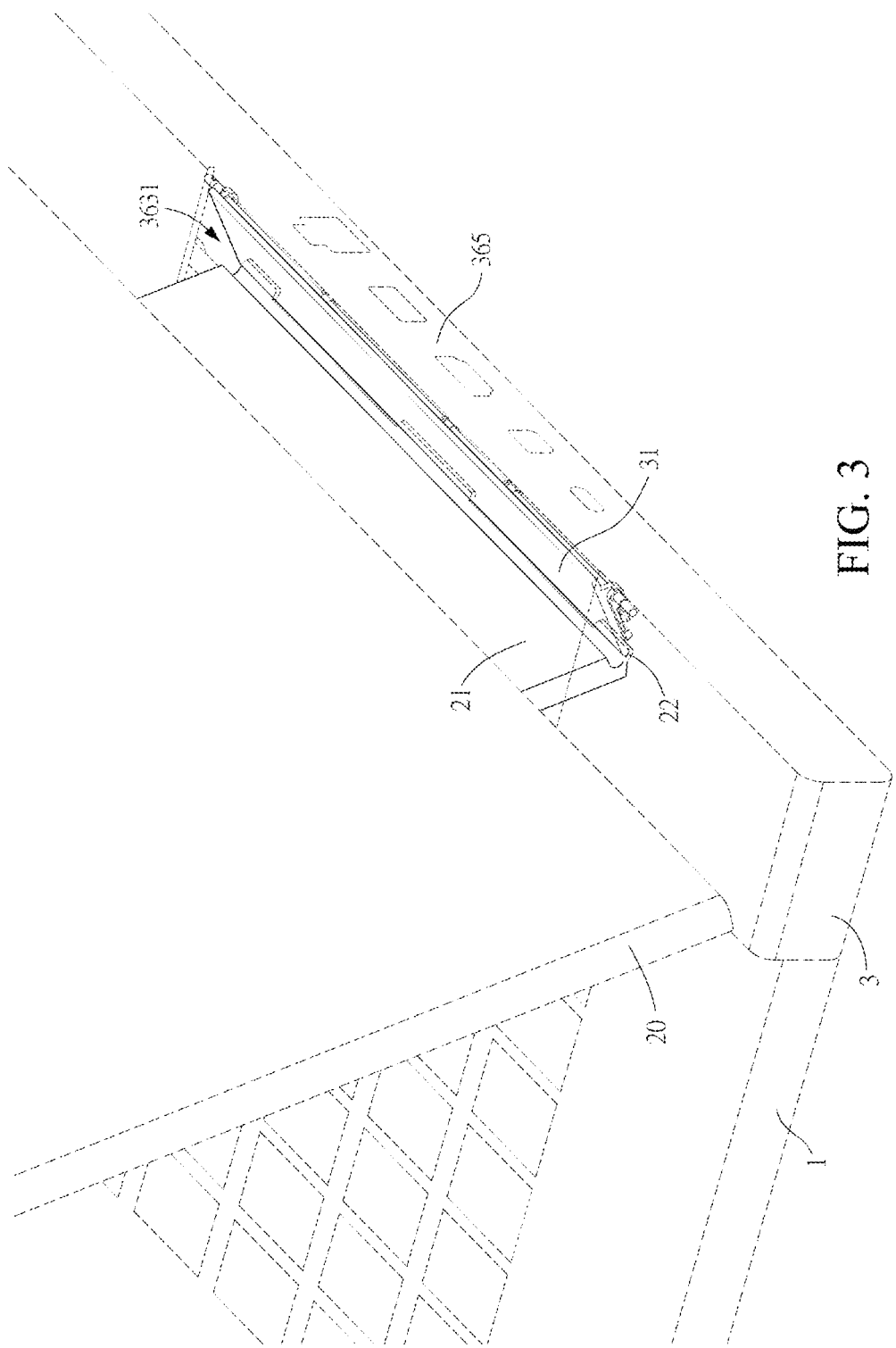
FIG. 3 is a rear view of a heat dissipation structure during operation according to an embodiment of the present disclosure.
Figure 4A:
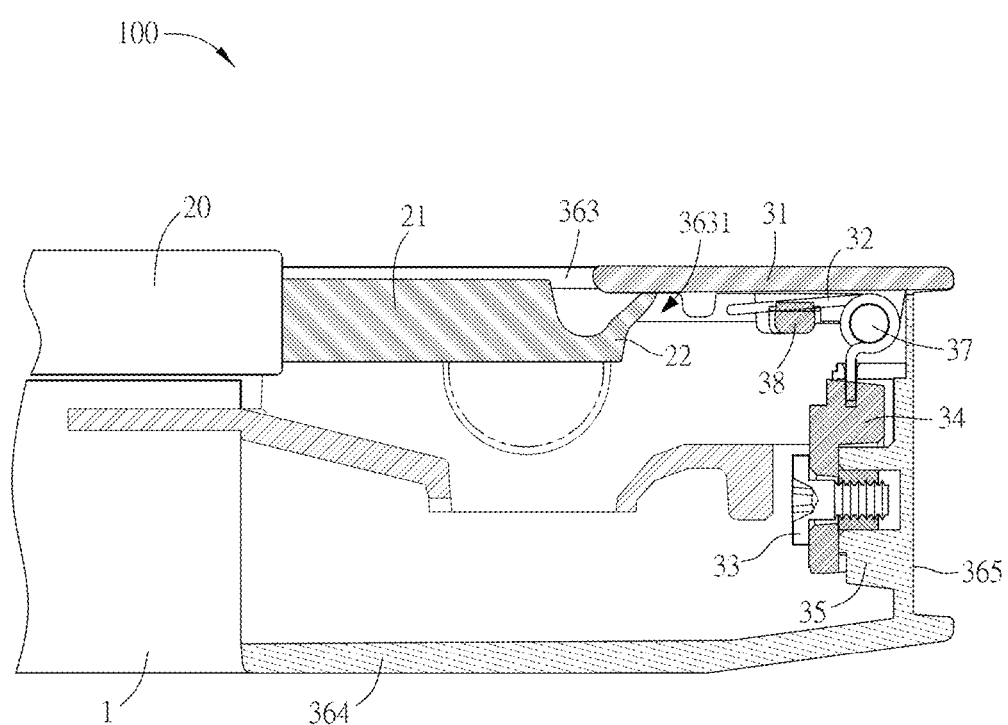
FIG. 4A to FIG. 4C are schematic cross-sectional views of cover opening movement according to an embodiment of the present disclosure.

Next, referring to FIG. 3 and FIG. 4A to FIG. 4C, movement of the hatch cover 31 when the laptop 100 shown in this embodiment is opened and closed is described. First, as shown in FIG. 4A, the screen 2 is in a closed state, and the screen body 20 is substantially horizontally covered on the host 1 at an angle of 0°. In this case, the clamp member 21 is also horizontal, the clamp portion 22 urges and contacts the hatch cover 31, the hatch cover 31 closes the heat dissipation opening 3631, and the hatch cover 31 and the upper plate 363 are substantially parallel. In this case, the upper plate 363, the hatch cover 31, and the clamp member 21 are substantially parallel to the screen body 20, thereby maintaining the integrity of the appearance. In addition, the heat dissipation opening 3631 is closed by the hatch cover 31, thereby preventing foreign objects (such as dust or sand) from entering. In this case, the elastic member 32 is in a stressed and deformed state, and thus stores elastic potential energy. The heat dissipation structure 3 is in a closed state.

Figure 4B:
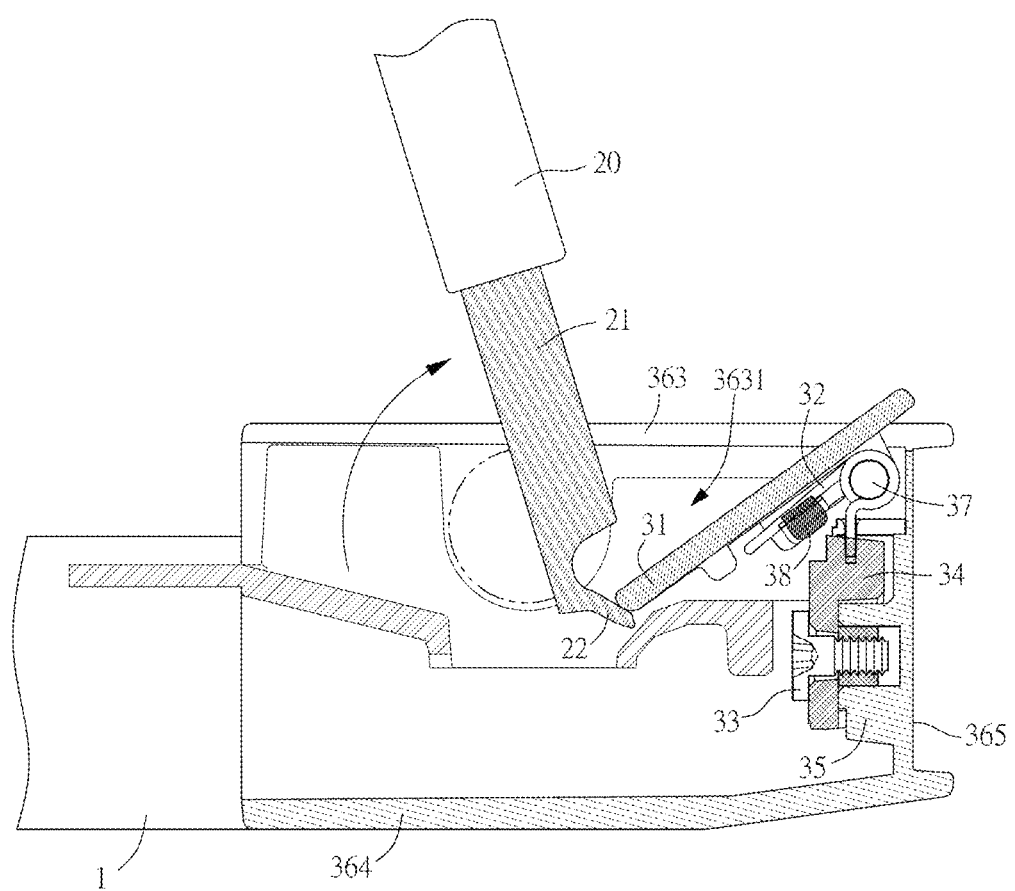
Figure 4C:
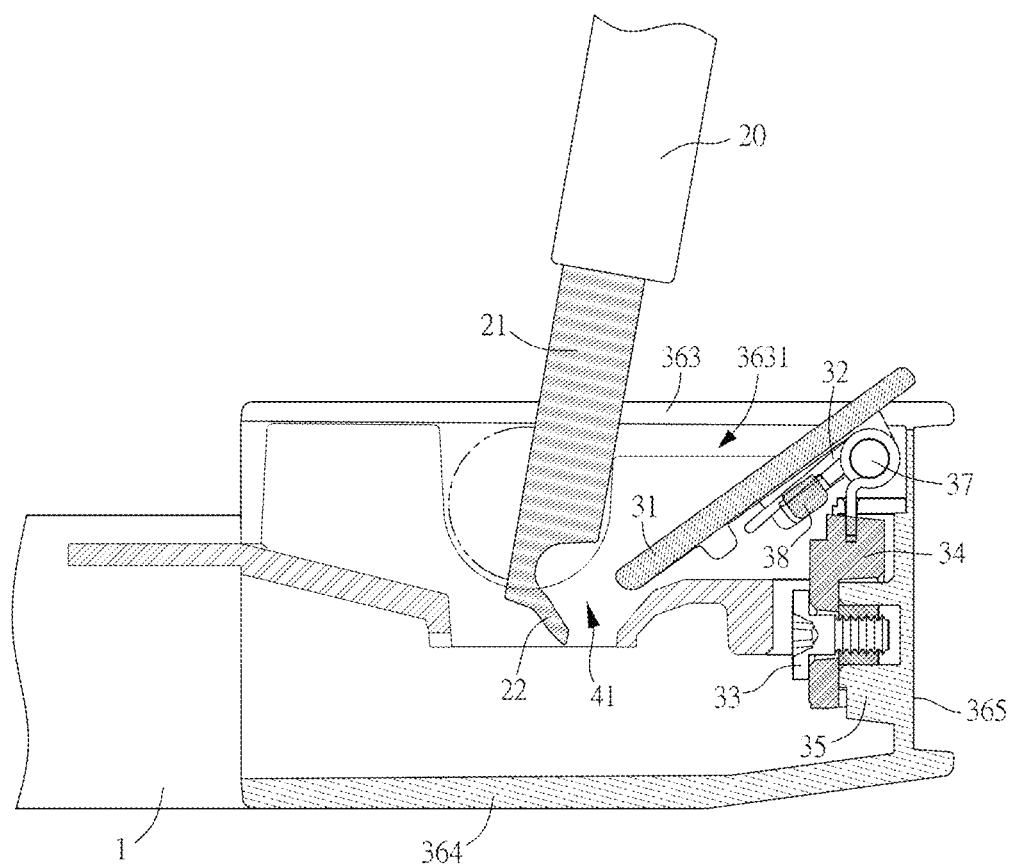

When the screen 2 is pivotally open with respect to the host 1, that is, changes from a closed state to an open state, the screen body 20 and the clamp member 21 rotate together. In this embodiment, a rotation direction of the screen body 20 and the clamp member 21 is clockwise. The clamp portion 22 also rotates to reduce a force urging the hatch cover 31, to enable the elastic member 32 to release the stored elastic potential energy and the hatch cover 31 to rotate counterclockwise. As shown in FIG. 4B, as an opening angle of the screen 2 increases, the clamp portion 22 rotates counterclockwise, and a contact position thereof abutting against the hatch cover 31 moves toward an edge of the hatch cover 31. Referring to FIG. 3, the hatch cover 31 and the clamp member 21 form an included angle. As the opening angle of the screen 2 continues to increase, the clamp member 21 continues to rotate, to separate from the hatch cover 31. In this case, as shown in FIG. 4C, the hatch cover 31 is loosely inclined downward because the elastic member 32 is no longer stressed and deformed, and has no function of elastic potential energy. In addition, referring to FIG. 2B, because the back case body 36 is provided with a plurality of oblique stop blocks 40 at the joint with the long side of the hatch cover, the drooping hatch cover 31 is restricted by the oblique stop blocks 40 and does not continue to droop, and leans loosely on the oblique stop blocks 40.

As shown in FIG. 4C, when the opening angle of the screen 2 continues to increase, and reaches beyond a critical angle (for example, an angle greater than 90° with respect to the host 1), the clamp portion 22 no longer abuts against the hatch cover 31 but is separated from the hatch cover 31. The hatch cover 31 is not affected by the elastic potential energy of the elastic member 32, and is thus inclined with respect to the upper plate 363 toward the rear plate 365. A bottom of the hatch cover 31 is restricted by the oblique stop blocks 40 and stops rotating. The hatch cover 31 is in a loose state. The hatch cover 31 stays at an inclined position. The clamp portion 22 is not in contact with the hatch cover 31. In this way, when the screen 2 is in the open state, behind the screen 2, a heat dissipation channel 41 is formed between the clamp portion 22 and the hatch cover 31 and communicates with the heat dissipation opening 3631, so that heat generated by the host 1 during operation can be dissipated outward through the heat dissipation channel 41, to facilitate the heat dissipation of the laptop and maintain good usage efficiency. Moreover, in addition to the manner described in this embodiment, other active heat dissipation mechanisms such as fans, water cooling, and a design of heat dissipation fins combined with heat pipes may be further used to further improve the heat dissipation efficiency.

When the screen 2 rotates to be closed towards the host 1 in a direction opposite to a direction when being open, that is, FIG. 4C gradually changes to FIG. 4B and then changes to FIG. 4A, the screen body 20 and the clamp member 21 rotate together. In this embodiment, the screen body 20 and the clamp member 21 rotate counterclockwise, and drive the clamp portion 22 to rotate. When the clamp portion 22 abuts against the hatch cover 31 and urges the hatch cover 31 upward to rotate back to a horizontal position, the heat dissipation opening 3631 of the upper plate 363 is closed. When the screen 2 is in the closed state, the clamp portion 22 urges and contacts the hatch cover 31, the hatch cover 31 closes the heat dissipation opening 3631, the hatch cover 31 and the upper plate 363 are substantially parallel, and the heat dissipation structure 3 is in the closed state. In this way, when the screen 2 is closed and the laptop 100 is not in use (for example, in hibernation), the appearance can be maintained flat, and there are no extra holes, and foreign objects such as dust can be prevented from entering the laptop 100.

Based on the above, the heat dissipation structure of the laptop according to the present disclosure can add an additional heat dissipation mechanism to dissipate heat energy when the laptop is operating, which is beneficial to the heat dissipation of the laptop. In addition, there is no need for a user to manually switch on/off the heat dissipation structure according to the present disclosure. The heat dissipation structure automatically opens as the screen is open with respect to the host, and closes as the screen is closed with respect to the host. Relatively good heat dissipation efficiency is achieved in accordance with usage of the laptop.

The foregoing descriptions are merely examples, and are not intended to become a limitation. Any equivalent modification or change made to the present disclosure without departing from the spirit and scope of the present disclosure should fall within the appended claims of this application.

What is claimed is:

1. A laptop, comprising:
   a host;
   a screen, pivotally connected to the host, the screen comprising a clamp member; and
   a heat dissipation structure, connected to the host adjacent to where the screen is pivotally connected and covering a back of the host, the heat dissipation structure comprising:
      a back case body, defining a heat dissipation opening, wherein the clamp member rotates with opening and closing of the screen to the host inside the back case body, and the heat dissipation opening communicates with the back case body and an inside of the host; and
      a hatch cover, one side thereof being pivotally connected to the back case body, the hatch cover being set to match the heat dissipation opening, wherein
   when the screen is closed with respect to the host, the clamp member urges the hatch cover to close the heat dissipation opening; and when the screen is open with respect to the host, the clamp member is released from the hatch cover, and the hatch cover rotates to expose the heat dissipation opening.

2. The laptop according to claim 1, wherein the heat dissipation structure further comprises:
   an elastic member, disposed at where the hatch cover is pivotally connected, wherein two ends of the elastic member abut against the hatch cover and the back case body respectively, and the elastic member is configured to provide, when subject to a force, a force for the hatch cover to rotate.

3. The laptop according to claim 1, wherein the elastic member is a torsion spring.

4. The laptop according to claim 1, wherein the elastic member is mounted at two ends of a long side of the hatch cover.

5. The laptop according to claim 1, wherein when the screen is closed with respect to the host, the hatch cover is substantially horizontal.

6. The laptop according to claim 1, wherein the back case body is provided with a plurality of protruding blocks close to where the hatch cover is pivotally connected, to limit a rotation range of the hatch cover.

7. The laptop according to claim 6, wherein the plurality of protruding blocks are each provided with a bevel.

8. A heat dissipation structure, applied to a laptop, the laptop comprising a host and a screen, the screen being pivotally connected to the host and comprising a clamp member, the heat dissipation structure being connected to the host adjacent to where the screen is pivotally connected and covering a back of the host, and the heat dissipation structure comprising:
   a back case body, defining a heat dissipation opening, wherein the clamp member is located inside the back case body, and the heat dissipation opening communicates with an inside of the back case body; and
   a hatch cover, one side thereof being pivotally connected to the back case body, and a shape of the hatch cover matching a shape of the heat dissipation opening, wherein
   when the screen is closed with respect to the host, the clamp member urges the hatch cover to rotate to close the heat dissipation opening; and when the screen is open with respect to the host, the clamp member is released from the hatch cover, and the hatch cover rotates to expose the heat dissipation opening.

9. The heat dissipation structure according to claim 8, further comprising:
   an elastic member, disposed at where the hatch cover is pivotally connected, wherein two ends of the elastic member abut against the hatch cover and the back case body respectively, and the elastic member is configured to provide, when subject to a force, a force for the hatch cover to rotate.

10. The heat dissipation structure according to claim 8, wherein the elastic member is a torsion spring.

11. The heat dissipation structure according to claim 8, wherein the elastic member is mounted at two ends of a long side of the hatch cover.

12. The heat dissipation structure according to claim 8, wherein when the screen is closed with respect to the host, the hatch cover is substantially horizontal.

13. The heat dissipation structure according to claim 8, wherein the back case body is provided with a plurality of protruding blocks close to where the hatch cover is pivotally connected, to limit a rotation range of the hatch cover.

14. The heat dissipation structure according to claim 13, wherein the plurality of protruding blocks are each provided with a bevel.

* * * * *